United States Patent
Garcia De Gorordo et al.

(10) Patent No.: US 11,515,166 B2
(45) Date of Patent: *Nov. 29, 2022

(54) CRYOGENIC ATOMIC LAYER ETCH WITH NOBLE GASES

(71) Applicant: Applied Materials, Inc., Santa Clara, CA (US)

(72) Inventors: Alvaro Garcia De Gorordo, Mountain View, CA (US); Zhonghua Yao, Santa Clara, CA (US); Sunil Srinivasan, San Jose, CA (US); Sang Wook Park, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/371,176

(22) Filed: Jul. 9, 2021

(65) Prior Publication Data

US 2021/0398815 A1 Dec. 23, 2021

Related U.S. Application Data

(63) Continuation of application No. 16/905,246, filed on Jun. 18, 2020, now Pat. No. 11,087,989.

(51) Int. Cl.
*H01L 21/306* (2006.01)
*H01L 21/3065* (2006.01)
(Continued)

(52) U.S. Cl.
CPC ...... *H01L 21/3065* (2013.01); *H01L 21/0234* (2013.01); *H01L 21/02112* (2013.01);
(Continued)

(58) Field of Classification Search
CPC .......... H01L 21/3065; H01L 21/02112; H01L 21/02263; H01L 21/0234; H01L 21/02348;
(Continued)

(56) References Cited

U.S. PATENT DOCUMENTS 6,127,273 A  10/2000  Laermer et al.
6,558,508 B1  5/2003  Kawakami
(Continued)

FOREIGN PATENT DOCUMENTS

KR       101313435       6/2008
KR   10-2010-0061731 A   6/2010

OTHER PUBLICATIONS

Notice of Allowance for U.S. Appl. No. 16/905,246 dated May 14, 2021.
(Continued)

*Primary Examiner* — Duy Vu N Deo
(74) *Attorney, Agent, or Firm* — Patterson + Sheridan, LLP

(57) ABSTRACT

A method for etching silicon at cryogenic temperatures is provided. The method includes forming an inert layer from condensation of a noble gas at cryogenic temperatures on exposed surfaces such as the sidewalls of a feature to passivate the sidewalls prior to the etching process. The method further includes flowing a fluorine-containing precursor gas into the chamber to form a fluorine-containing layer on the inert layer. The method further includes exposing the fluorine-containing layer and the inert layer to an energy source to form a passivation layer on the exposed portions of the substrate and exposing the substrate to ions to etch the substrate.

20 Claims, 5 Drawing Sheets

(51) Int. Cl.
 H01L 21/02 (2006.01)
 H01L 21/311 (2006.01)
(52) U.S. Cl.
 CPC .. *H01L 21/02263* (2013.01); *H01L 21/02348* (2013.01); *B81C 2201/0138* (2013.01); *H01L 21/0228* (2013.01); *H01L 21/30655* (2013.01); *H01L 21/31116* (2013.01)
(58) Field of Classification Search
 CPC ........... H01L 21/0228; H01L 21/30655; H01L 21/31116; H01L 21/3086; B81C 2201/0138
 See application file for complete search history.

(56) References Cited

U.S. PATENT DOCUMENTS

| | | | |
|---|---|---|---|
| 6,949,722 | B2 | 9/2005 | Strang et al. |
| 7,161,121 | B1 | 1/2007 | Steger |
| 7,230,204 | B2 | 6/2007 | Mitrovic et al. |
| 7,435,353 | B2 | 10/2008 | Golovchenko et al. |
| 7,638,435 | B2 | 12/2009 | Lebouitz et al. |
| 7,651,583 | B2 | 1/2010 | Kent et al. |
| 8,007,591 | B2 | 8/2011 | Hamelin |
| 8,278,222 | B2 | 10/2012 | Wu et al. |
| 8,308,962 | B2 | 11/2012 | Floyd et al. |
| 8,323,516 | B2 | 12/2012 | Bita et al. |
| 8,377,253 | B2 | 2/2013 | Lebouitz et al. |
| 9,378,941 | B2 | 6/2016 | Nainani et al. |
| 9,659,789 | B2 | 5/2017 | Takeda et al. |
| 9,666,446 | B2 | 5/2017 | Tominaga et al. |
| 9,779,955 | B2 | 10/2017 | Lill et al. |
| 9,859,102 | B2 | 1/2018 | Tahara et al. |
| 9,966,273 | B2 | 5/2018 | Takayama et al. |
| 9,997,374 | B2 | 6/2018 | Takeda et al. |
| 10,283,398 | B2 | 5/2019 | Tanaka et al. |
| 11,087,989 | B1 * | 8/2021 | Garcia De Gorordo .................... H01L 21/3065 |
| 2002/0014894 | A1 | 2/2002 | Yonezawa et al. |
| 2008/0207001 | A1 | 8/2008 | Lebouitz et al. |
| 2008/0217293 | A1 | 9/2008 | Iimuro |
| 2009/0071932 | A1 | 3/2009 | Floyd et al. |
| 2009/0071933 | A1 | 3/2009 | Floyd et al. |
| 2009/0101623 | A1 | 4/2009 | Bita et al. |
| 2010/0022095 | A1 * | 1/2010 | Wu ....................... B08B 7/0035 438/719 |
| 2010/0084094 | A1 | 4/2010 | Lebouitz et al. |
| 2010/0122774 | A1 | 5/2010 | Makabe et al. |
| 2011/0062494 | A1 * | 3/2011 | Engelmann ......... H01L 29/7848 438/700 |
| 2016/0064231 | A1 | 3/2016 | Agarwal et al. |
| 2016/0064244 | A1 | 3/2016 | Agarwal et al. |
| 2016/0307734 | A1 | 10/2016 | Tahara et al. |
| 2017/0178922 | A1 | 6/2017 | Takashima et al. |
| 2017/0358460 | A1 | 12/2017 | Tomura et al. |
| 2017/0372911 | A1 | 12/2017 | Lill et al. |
| 2017/0372916 | A1 | 12/2017 | Kudo et al. |
| 2018/0076048 | A1 | 3/2018 | Gohira et al. |
| 2018/0197761 | A1 | 7/2018 | Ferrara et al. |
| 2018/0211822 | A1 | 7/2018 | Gohira et al. |
| 2018/0211824 | A1 | 7/2018 | Kudo et al. |
| 2018/0247826 | A1 | 8/2018 | Nakaya et al. |
| 2018/0247827 | A1 | 8/2018 | Nakaya et al. |
| 2018/0247858 | A1 | 8/2018 | Nakaya et al. |
| 2018/0286707 | A1 | 10/2018 | Hudson et al. |
| 2018/0294176 | A1 | 10/2018 | Nakagawasai |
| 2018/0350561 | A1 | 12/2018 | Yamaguchi et al. |
| 2019/0385860 | A1 | 12/2019 | Lee et al. |
| 2020/0027785 | A1 | 1/2020 | Roy et al. |
| 2020/0105508 | A1 | 4/2020 | Belau et al. |
| 2020/0185248 | A1 | 6/2020 | Sarode Vishwanath et al. |
| 2021/0005472 | A1 | 1/2021 | Kanarik et al. |

OTHER PUBLICATIONS

International Search Report and Written Opinion for International Application No. PCT/US2021/029214 dated Aug. 13, 2021.

* cited by examiner

CRYOGENIC ATOMIC LAYER ETCH WITH NOBLE GASES

CROSS-REFERENCE TO RELATED APPLICATIONS

This application is a continuation of U.S. patent application Ser. No. 16/905,246, filed Jun. 18, 2020 (now U.S. Pat. No. 11,087,989), which is herein incorporated by reference in its entirety.

BACKGROUND

Field

The present disclosure generally relates to methods of etching with noble gases at low temperatures.

Description of the Related Art

Reliably producing nanometer and smaller features is one of the technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to implementation of VLSI and ULSI and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development include processing at cryogenic temperatures. Dry reactive ion etching a substrate uniformly maintained at a cryogenic temperature enables ions to bombard the upward facing surfaces of materials disposed on the substrate with decreased spontaneous etching so that trenches with smooth, vertical sidewalls are formed. Additionally, selectivity of etching one material versus another can be improved at the cryogenic temperature. For example, selectivity between silicon (Si) and silicon dioxide ($SiO_2$) increases exponentially as temperature is decreased.

Conventional cryogenic fluorine-based etching processes tend to etch isotropically, which can lead to overetching the sidewalls of features in high aspect ratios, resulting in a loss of the critical dimensions of the features. One solution for protecting the sidewalls from overetching involves forming a passivation layer on the sidewalls such that the bottom portion of the feature is bombarded with ions while the sidewalls remain protected by the passivation layer. However, it is often difficult to balance the ratios of the etching gas and the passivation layer forming gas to properly control the rate of passivation and the rate of etching. In addition, the rate of passivation and the rate of etching change as aspect ratios change, which adds additional challenges to achieving a consistent uniform etch for multiple structures of different dimensions on a chip.

Thus, there is a need for improved methods of etching at cryogenic temperatures.

SUMMARY

The present disclosure generally relates to methods of etching with noble gases at low temperatures.

In one aspect, a method of etching a feature in a substrate is provided. The method includes cooling a substrate positioned in a chamber to a temperature below a triple point temperature of a first noble gas. The method further includes flowing the first noble gas into the chamber to form an inert layer on exposed portions of the substrate. The method further includes flowing a fluorine-containing precursor gas into the chamber to form a fluorine-containing layer on the inert layer. The method further includes exposing the fluorine-containing layer and the inert layer to an energy source to form a passivation layer on the exposed portions of the substrate and exposing the substrate to ions to etch the substrate.

Implementations may include one or more of the following. The temperature may be from about −105 degrees Celsius to about −120 degrees Celsius. The first noble gas may be selected from xenon and krypton. The fluorine-containing precursor gas may be selected from $SF_6$, $NF_3$ and $F_2$. Exposing the substrate to ions may further include applying an RF bias voltage to the substrate and forming the ions from a second noble gas. The second noble gas may be selected from helium, neon, argon, and xenon. The substrate may include a silicon oxide layer disposed on a silicon layer.

In another aspect, a method of etching a feature in a substrate is provided. The method includes receiving a substrate comprising silicon on a substrate support in a chamber, the substrate support having a chiller operable to cool the substrate. The method further includes cooling the substrate by cooling the chiller to a temperature of about −100 degrees Celsius or lower. The method further includes flowing a xenon precursor gas into the chamber to coat portions of a surface of the silicon with a xenon layer. The method further includes flowing a fluorine-containing precursor gas into the chamber to coat the xenon layer with a fluorine-containing layer. The method further includes exposing the xenon layer and the fluorine-containing layer to an energy source to form a xenon fluoride passivation layer and exposing the substrate to ions to etch silicon from the surface of the silicon.

Implementations may include one or more of the following. The temperature may be from about −105 degrees Celsius to about −120 degrees Celsius. The fluorine-containing precursor gas may be selected from $SF_6$, $NF_3$, and $F_2$. Exposing the substrate to ions may further include applying an RF bias voltage to an electrode in the substrate support and flowing a noble gas into the chamber. The noble gas may be helium. The xenon fluoride passivation layer may form on sidewalls of a feature formed in the substrate and prevents or slows lateral etching of the feature as the feature is etched in a vertical direction in the substrate. A layer of silicon oxide may be formed on at least a portion of the silicon. The substrate may have at least one feature thereon, the at least one feature extending a feature depth from a top surface of the substrate to a bottom surface, the at least one feature having a width defined by a first sidewall and a second sidewall, wherein the passivation layer is formed on the top surface of the substrate, the first sidewall, the second sidewall, and the bottom surface of the at least one feature.

In yet another aspect, a method of etching a feature in a substrate is provided. The method includes receiving a substrate comprising silicon on a substrate support in a chamber, the substrate having a substrate surface and at least one feature formed thereon, the at least one feature extending from the substrate surface and having sidewalls and a bottom surface, the substrate support having a chiller operable to cool the substrate. The method further includes cooling the substrate by cooling the chiller to a temperature of about −100 degrees Celsius or lower. The method further includes forming a passivation layer over the substrate surface, the sidewalls, and the bottom surface of the at least one feature. Forming the passivation layer includes flowing a xenon precursor gas into the chamber to coat portions of the substrate surface with a xenon layer; flowing a fluorine-containing precursor gas into the chamber to coat the xenon layer with a fluorine-containing layer; and exposing the xenon layer and the fluorine-containing layer to a plasma to form the passivation layer. The method further includes exposing the substrate to ions to etch silicon from the bottom surface.

Implementations may include one or more of the following. The temperature may be from about −105 degrees Celsius to about −120 degrees Celsius. The fluorine-containing precursor gas may be selected from $SF_6$, $NF_3$, and $F_2$. Exposing the substrate to ions further includes applying an RF bias voltage to an electrode in the substrate support and flowing a noble gas into the chamber. The noble gas may be helium.

In another aspect, a non-transitory computer readable medium has stored thereon instructions, which, when executed by a processor, causes the process to perform operations of the above methods.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
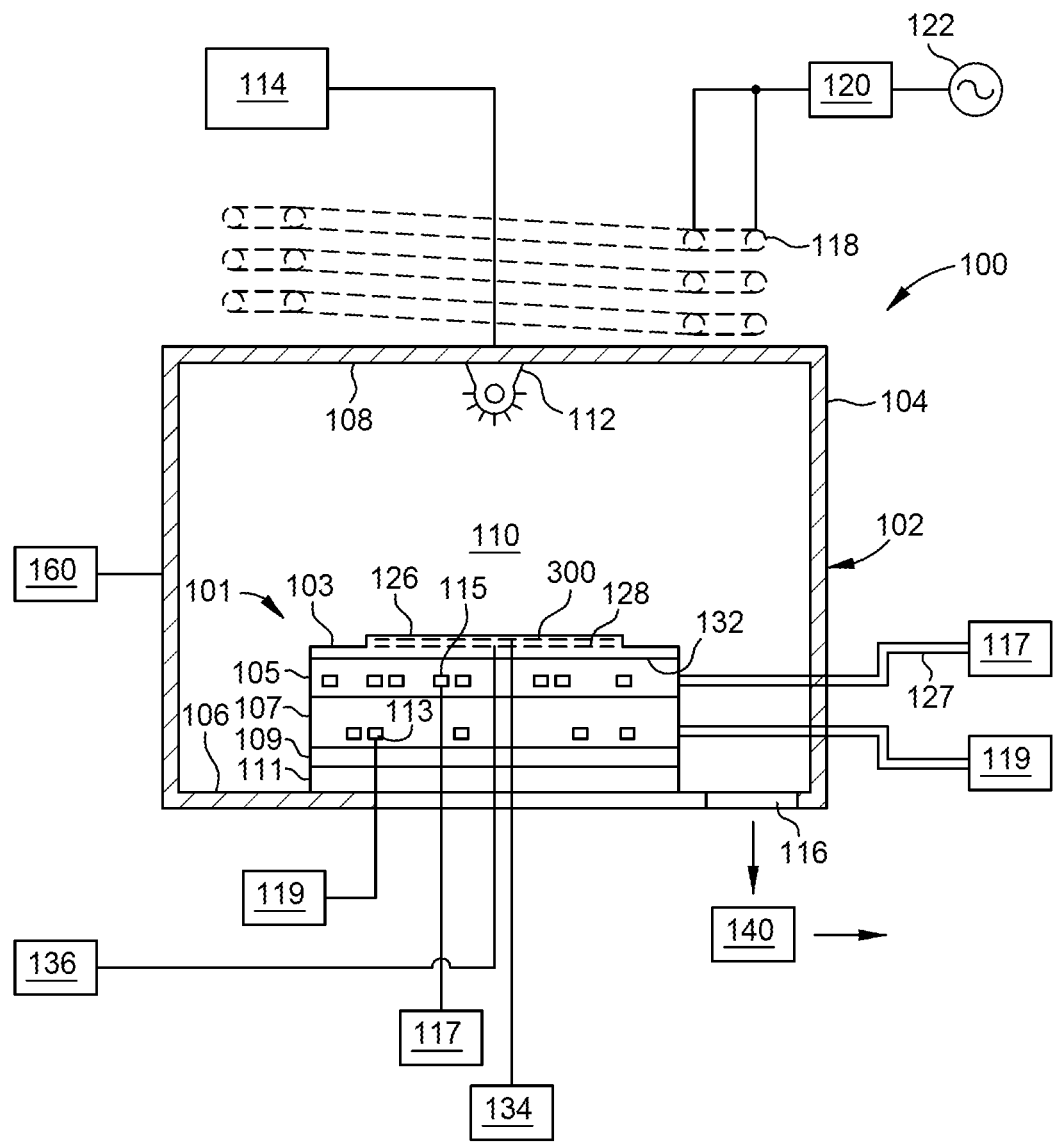
FIG. 1 illustrates a cross-sectional view of one example of a plasma processing chamber according to aspects disclosed herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes cryogenic etching of features. Certain details are set forth in the following description and in FIGS. 1-3E to provide a thorough understanding of various implementations of the disclosure. Other details describing well-known structures and systems often associated with cryogenic etching are not set forth in the following disclosure to avoid unnecessarily obscuring the description of the various implementations. In addition, the apparatus description described herein is illustrative and should not be construed or interpreted as limiting the scope of the implementations described herein.

Many of the details, operations, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

A feature is a recess in the surface of a substrate. Features can have many different shapes including, but not limited to, cylinders, ovals, rectangles, squares, other polygonal recesses, and trenches.

Aspect ratios are a comparison of depth of a feature to the critical dimension of the feature (e.g., width/diameter). The features formed through the disclosed methods may be high aspect ratio features. In some implementations, a high aspect ratio feature is one having an aspect ratio of at least about 5, at least about 10, at least about 20, at least about 30, at least about 40, at least about 50, at least about 60, at least about 80, or at least about 100. The critical dimension of the features formed through the disclosed methods may be about 200 nm or less, for example about 100 nm or less, about 50 nm or less, or about 20 nm or less.

In some etching processes, low temperature etching such as cryogenic etching is used to remove materials in devices with high aspect ratio (HAR) features at cold temperatures. Cryogenic etching cools the device during the etching process to prevent unwanted side reactions that can affect the etch profiles of the features. Conventional cryogenic fluorine-based etching processes tend to etch isotropically, which can overetch the sidewalls of the features, resulting in a loss of the critical dimensions of the features. One solution for protecting the sidewalls from overetching uses oxygen to passivate silicon sidewalls of the feature. Oxygen reacts with the silicon sidewalls to form a silicon oxide passivation layer such that the bottom portion of the feature is bombarded with ions while the sidewalls are protected by the silicon oxide passivation layer. However, it is difficult to balance the ratios of fluorine and oxygen to control the passivation rates and etch rates. In addition, the passivation rate and etch rates change as aspect ratios change, which can make it difficult to achieve a consistent uniform etch for multiple structures having different aspect ratios on the same chip. Further, the formation of the silicon oxide passivation layer consumes silicon from the sidewall of the feature, which can affect the critical dimensions of the feature.

In one aspect of the present disclosure, a method for etching at cryogenic temperatures is provided. The method forms an inert layer from a noble gas on exposed surfaces such as the sidewalls of the feature to passivate the sidewalls prior to the etching process. The inert layer suppresses spontaneous etching, thus enabling the use of aggressive chemistries like fluorine for etching HAR features.

In one implementation, the substrate containing the feature is cooled to a temperature around the triple point of the noble gas. Not to be bound by theory but it is believed that cooling the substrate to a temperature around the triple point of the noble gas allows the condensed noble gas to flow by surface dispersion forces and passivate the exposed surfaces of the feature. Unlike passivation with oxygen, the inert layer does not consume silicon like the known oxygen-based processes. The substrate is then exposed to a fluorine-containing gas to form a fluorine-containing layer on the inert layer. The presence of the inert layer prevents the fluorine-containing gas from etching the feature. The inert layer and the fluorine-containing layer are then exposed to an energy source, such as a plasma or an ultraviolet photon activation, to form a passivation layer from the inert layer and the fluorine-containing layer. The substrate is then exposed to ions to anisotropically etch material from upward facing surfaces of the substrate.

FIG. 1 is a cross-sectional schematic view of one example of a plasma processing chamber 100, shown configured as an etch chamber, having a substrate support assembly 101. The plasma processing chamber 100 can be used to perform the cryogenic etching processes described herein. The substrate support assembly 101 is operable to uniformly maintain a surface or workpiece, such as a substrate 300, at a cryogenic processing temperature. Dry reactive ion etching of the substrate 300 maintained at a cryogenic processing temperature enables ions to bombard the upward facing surfaces of materials disposed on the substrate 300 with decreased spontaneous etching so that trenches with smooth, vertical sidewalls are formed. For example, diffusion of ions in porosities of a low-k dielectric material disposed on the substrate 300 uniformly maintained at the cryogenic processing temperature is decreased while ions continue to bombard the upward facing surface of the low-k dielectric material to form trenches with smooth, vertical sidewalls. Additionally, selectivity of etching one material versus another can be improved at the cryogenic processing temperature. For example, selectivity between silicon (Si) and silicon dioxide ($SiO_2$) increases exponentially as temperature is decreased.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Process gases, along with any processing by-products, are removed from the processing region 110 through an exhaust port 116 formed in the sidewalls 104 or bottom 106 of the chamber body 102. The exhaust port 116 is coupled to a pumping system 127, which includes throttle valves and pumps utilized to control the vacuum levels within the processing region 110.

The process gases may be energized to form a plasma within the processing region 110. The process gases may be energized by capacitively or inductively coupling RF power to the process gases. A plurality of coils 118 are disposed above the lid 108 of the plasma processing chamber 100 and coupled through a matching circuit 120 to an RF power source 122. The RF power source 122 can be low frequency, high frequency, or very high frequency.

The substrate support assembly 101 is disposed in the processing region 110 below the injection apparatus 112. The substrate support assembly 101 includes an ESC 103 and an ESC base assembly 105. The ESC base assembly 105 is coupled to the ESC 103 and a facility plate 107. The facility plate 107 is supported by a ground plate 111 and is configured to facilitate electrical, cooling, heating, and gas connections with the substrate support assembly 101. The ground plate 111 is supported by the bottom 106 of the processing chamber. An insulator plate 109 insulates the facility plate 107 from the ground plate 111.

The ESC base assembly 105 includes a base channel 115 coupled to a cryogenic chiller 117. The cryogenic chiller 117 provides a base fluid, such as a refrigerant, to the base channel 115 so that the ESC base assembly 105, and consequently, the substrate 300, may be maintained at a predetermined cryogenic temperature. Similarly, the facility plate 107 includes a facility channel 113 coupled to a chiller 119. The chiller 119 provides facility fluid to the facility channel 113 so that the facility plate 107 is maintained at a predetermined temperature. In one example, the base fluid maintains the ESC base assembly 105 at a temperature greater than a temperature of the facility plate 107. In one aspect, which can be combined with other aspects described herein, the cryogenic chiller 117 is coupled to an interface box to control a flow rate of a base fluid. The base fluid comprises a composition that remains a liquid at a cryogenic temperature less than −50 degrees Celsius at operating pressures. The base fluid is generally insulative so that an electrical path is not formed through the base fluid when circulated through the substrate support assembly 101. A non-limiting example of suitable facility fluid includes fluorinated heat transfer fluids.

The ESC 103 has a support surface 130 and a bottom surface 132 opposite the support surface 130. The ESC 103 can be fabricated from a ceramic material, such as alumina ($Al_2O_3$), aluminum nitride (AlN) or other suitable material or a polymer, such as polyimide, polyetheretherketone (PEEK), polyaryletherketone (PAEK), and the like.

The ESC 103 includes a chucking electrode 126 disposed therein. The chucking electrode 126 may be configured as a monopolar or bipolar electrode, or other suitable arrangement. The chucking electrode 126 is coupled through an RF filter and the facility plate 107 to a chucking power source 134, which provides a DC power to electrostatically secure the substrate 300 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein. The resistive heaters 128 are utilized to control the temperature of the ESC 103, which is cooled by the ESC base assembly 105; such that cryogenic processing temperatures suitable for processing a substrate 300 disposed on the support surface 130 of the substrate support assembly 101 may be maintained. The resistive heaters 128 are coupled through the facility plate 107 and an RF filter to a heater power source 136. The RF filter prevents RF power utilized to form a plasma (not shown) within the plasma processing chamber 100 from damaging electrical equipment or presenting an electrical hazard outside the chamber. The heater power source 136 may provide 500 watts or more power to the resistive heaters 128. The heater power source 136 includes a controller (not shown) utilized to control the operation of the heater power source 136, which is generally set to heat the substrate 300 to a predetermined cryogenic temperature. In one aspect, which can be combined with other aspects described herein, the resistive heaters 128 include a plurality of laterally separated heating zones, wherein the controller enables at least one zone of the resistive heaters 128 to be preferentially heated relative to the resistive heaters 128 located in one or more of the other zones. For example, the resistive heaters 128 may be arranged concentrically in a plurality of separated heating zones. The resistive heaters 128 maintain the substrate 300 at a cryogenic processing temperature suitable for processing. In one aspect, which can be combined with other aspects described herein, the cryogenic processing temperature is less than about −10 degrees Celsius. For example, the cryogenic processing temperature is between about −10 degrees Celsius to about −150 degrees Celsius.

The plasma processing chamber 100 further includes a system controller 160 operable to control various aspects of the plasma processing chamber 100. The system controller 160 facilitates the control and automation of the overall plasma processing chamber 100 and may include a central processing unit (CPU), memory, and support circuits (or I/O). Software instructions and data can be coded and stored within the memory for instructing the CPU. The system controller 160 can communicate with one or more of the components of the plasma processing chamber 100 via, for example, a system bus. A program (or computer instructions) readable by the system controller 160 determines which tasks are performable on a substrate. In some aspects, the program is software readable by the system controller 160, which can include code to control one or more components of the plasma processing chamber 100. Although shown as a single system controller 160, it should be appreciated that multiple system controllers may be used with the aspects described herein.

Figure 2:
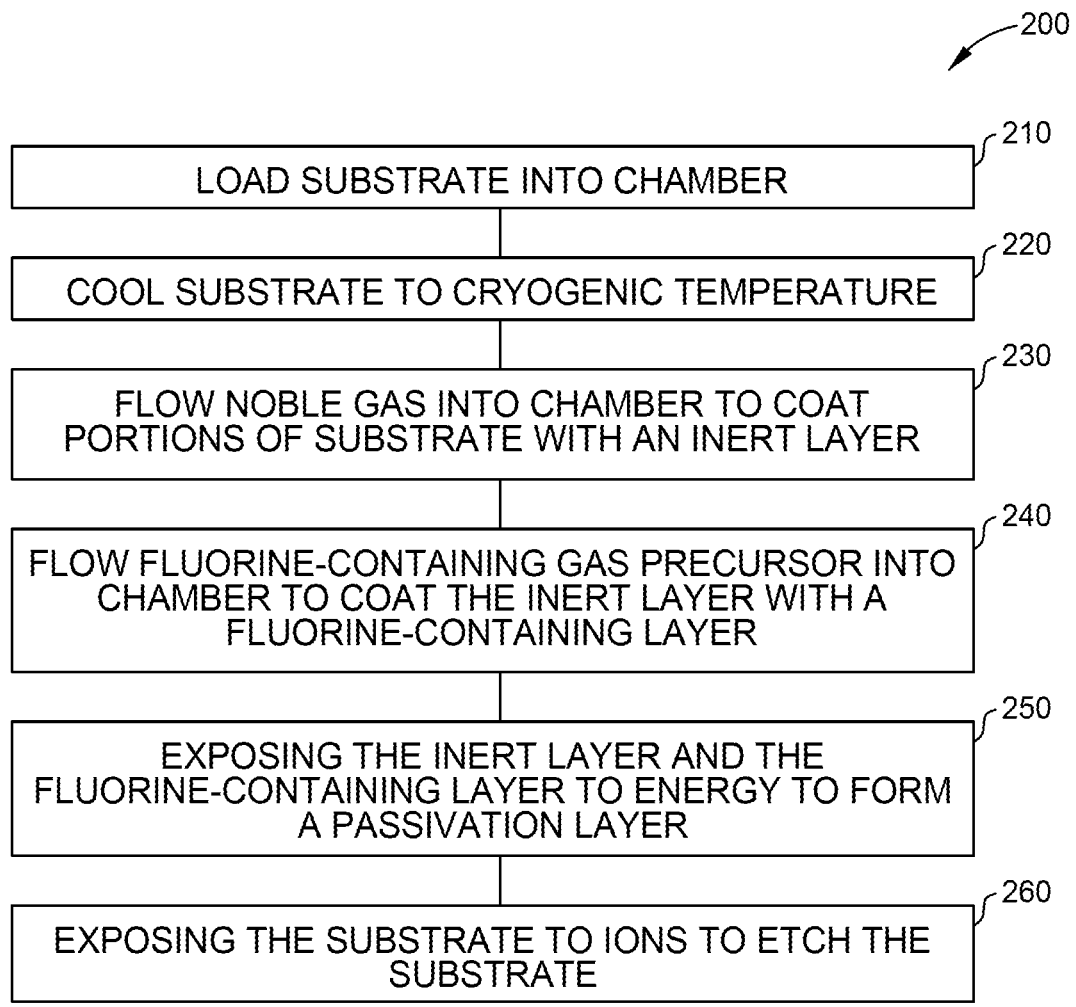
FIG. 2 illustrates a flowchart of a method of etching a feature in a substrate according to aspects disclosed herein.

FIG. 2 illustrates a flowchart of a method 200 of etching a feature in a substrate according to aspects disclosed herein. FIGS. 3A-3E illustrate various stages of an etching process according to aspects disclosed herein. Although method 200 and FIGS. 3A-3E are discussed in the context of etching a high aspect ratio feature in a silicon substrate it should be understood that method 200 may be used to etch other features in other types of substrates.

The method 200 begins at operation 210 by loading a substrate into a chamber, such as the plasma processing chamber 100 depicted in FIG. 1. In one example, the substrate 300 is positioned on substrate support assembly, such as substrate support assembly 101, having a chiller, such as chiller 119, operable to cool the substrate. The substrate can be substrate 300. The substrate 300 includes a bulk silicon layer 310 having a mask layer 312, for example, a dielectric layer such as a silicon oxide layer, disposed thereon. The substrate 300 without the mask layer 312 (i.e., just the silicon layer 310) can also be processed according to the method 200. The substrate 300 has at least one feature 320 formed thereon. The at least one feature 320 extends a feature depth from a top surface 322 of the substrate 300 to a bottom surface 324. The at least one feature 320 has a width defined by a first sidewall 326a and a second sidewall 326b.

The method 200 continues at operation 220 where the substrate 300 is cooled to a cryogenic temperature. As used herein, cryogenic temperature refers to a temperature that is about −100 degrees Celsius or lower. In some examples, a cryogenic temperature may be within a certain range, for example from about −160 degrees Celsius to −150 degrees Celsius, or from about −140 degrees Celsius to −120 degrees Celsius, or between about −120 degrees Celsius to about −100 degrees Celsius. In some examples, the substrate 300 is cooled to a temperature of about −100 degrees Celsius or below, or about −120 degrees Celsius or below, or about −140 degrees Celsius or below, or about −150 degrees Celsius or below. In these or other examples, the substrate 300 may be cooled to a temperature that is about −150 degrees Celsius or higher, or about −140 degrees Celsius or higher, or about −120 degrees Celsius or higher, or about −100 degrees Celsius or higher. The ideal range will depend on a variety of factors including, but not limited to, the chemistry being used, for example, the triple point temperature of the noble gas used, the geometry of the features being etched, and the type of material being etched. As mentioned elsewhere herein, the temperature of the substrate may be controlled via a chiller. The temperature of the chiller may be lower than the temperature of the substrate itself.

As used herein, the temperature of the substrate is intended to refer to the temperature of the substrate support assembly, unless otherwise noted. This temperature may also be referred to as the chiller temperature. The substrate support assembly can control the temperature of the substrate using various heating and cooling mechanisms.

In one aspect, cooling of the substrate to the cryogenic temperature can involve flowing cooling fluids through piping in or adjacent the substrate support. In another aspect, cooling of the substrate to the cryogenic temperature can involve circulation within the substrate support of single or mixed refrigerants at cryogenic temperatures. In one example, the substrate 300 is cooled using the cryogenic chiller 117 to cool the substrate 300 to the cryogenic temperature.

Figure 3A:
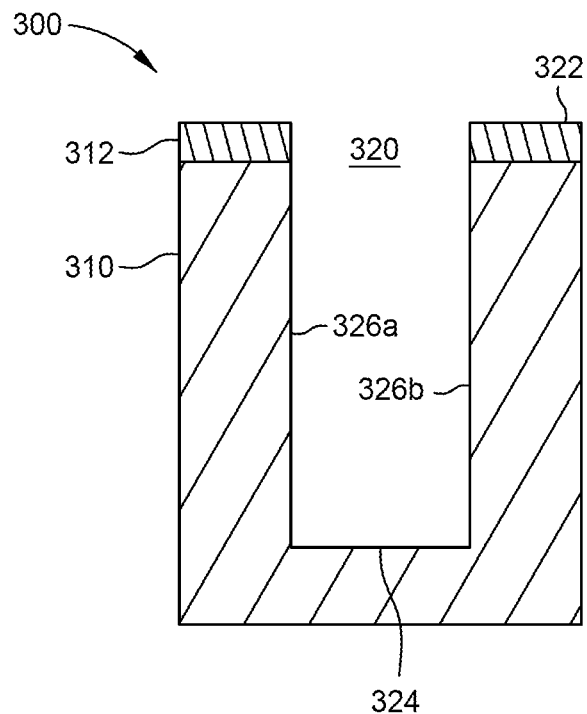
FIGS. 3A-3E illustrate various stages of an etching process according to aspects disclosed herein.
Figure 3B:
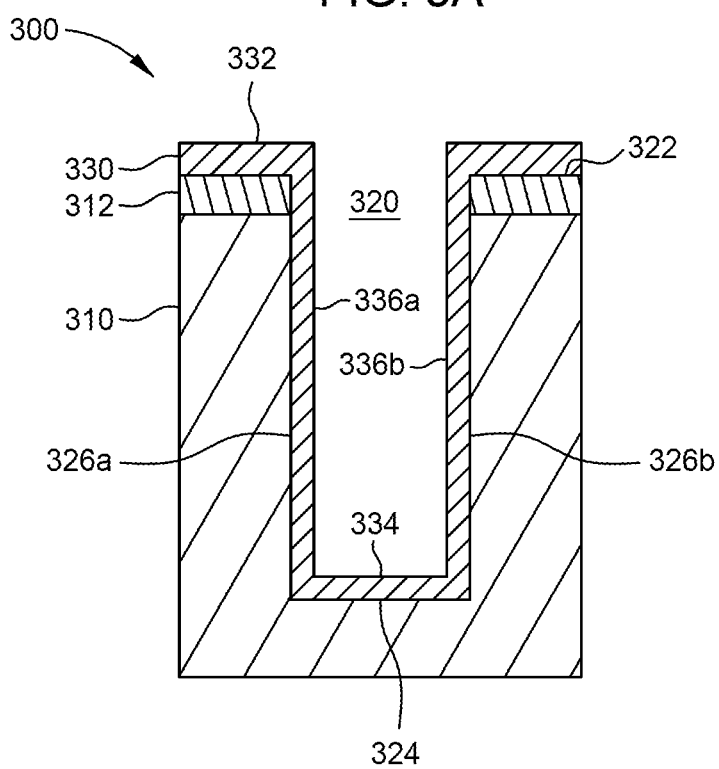

The method 200 continues at operation 230, where a noble gas mixture is flowed into the chamber to coat portions of the substrate with an inert layer 330 as shown in FIG. 3B. The noble gas mixture includes, consists of, or consists essentially of a first noble gas. As used herein, the term "consists essentially of a first noble gas" means that the noble gas component of the noble gas mixture is greater than or equal to about 95%, 98%, or 99% of the noble gas mixture. The first noble gas is selected from argon (Ar), helium (He), neon (Ne), xenon (Xe), krypton (Kr), or a combination thereof. In one example, the first noble gas is xenon or a xenon precursor gas. In another example, the first noble gas is krypton. The noble gas mixture is typically etchant-free meaning that the noble gas mixture does not contain any etchant gases. In one example, the processing region 110 consists of or consists essentially of the first noble gas during operation 230. In one example, operation 230 is a plasma-free operation meaning that plasma is not present in the processing region 110. Unlike passivation with oxygen, the inert layer 330 does not consume silicon like the known oxygen-based processes.

The inert layer 330 is formed when the first noble gas condenses on the exposed surfaces of the substrate 300. In the example depicted in FIG. 3B, the inert layer 330 is formed on the on the top surface 322, the bottom surface 324, the first sidewall 326a, and the second sidewall 326b. The inert layer 330 can be a conformal layer or a non-conformal layer. During operation 230, the noble gas mixture is flowed into the processing region 110 while the substrate 300 is maintained at the cryogenic temperature. The cryogenic temperature is selected such that the noble gas mixture can flow by surface dispersion forces and passivate the exposed surfaces of the substrate 300. In one example, the cryogenic temperature is selected to encompass the triple point temperature of the noble gas.

In one example, where the noble gas is xenon, which has a triple point temperature of about −112 degrees Celsius, the cryogenic temperature is maintained in a range from about −140 degrees Celsius to about −100 degrees Celsius, for example, in a range from about −120 degrees Celsius to about −105 degrees Celsius or from about −112 degrees Celsius to about −105 degrees Celsius. Maintaining the substrate at a cryogenic temperature, which encompasses the triple point temperature, allows xenon to flow into the processing region 110 as a gas and condense on the chilled substrate 300 to form the xenon layer and passivate exposed surfaces of the feature.

In another example, where the noble gas is krypton, which has a triple point of about −158 degrees Celsius, the cryogenic temperature is maintained in a range from about −150 degrees Celsius to about −170 degrees Celsius, for example, from about −158 degrees Celsius to about −150 degrees Celsius. Cooling the substrate to a temperature slightly around or slightly above −158 degrees allows condensed krypton to form a krypton layer and passivate exposed surfaces of the feature.

In one example, during operation 230, for a 300 mm substrate in an appropriately sized chamber, the flow rate of the noble gas can be from about 50 sccm to about 500 sccm (e.g., from about 50 sccm to about 300 sccm). The noble gas can be flowed into the chamber to maintain an overall chamber pressure of about 10 mTorr to about 100 mTorr (e.g., between about 25 mTorr and about 80 mTorr; between about 30 mTorr and about 70 mTorr; between about 25 mTorr and about 40 mTorr; or between about 60 mTorr and about 80 mTorr).

Figure 3C:
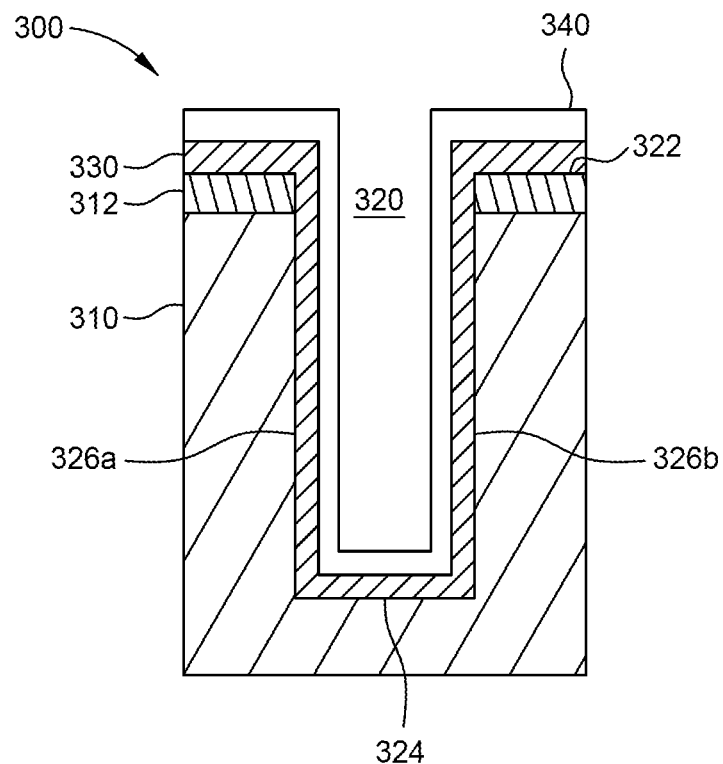

The method 200 continues at operation 240, where a fluorine-containing gas mixture is flowed into the chamber to coat the inert layer 330 with a fluorine-containing layer 340 as shown in FIG. 3C. The fluorine-containing gas mixture includes, consists of, or consists essentially of a fluorine-containing gas. As used herein, the term "consists essentially of a fluorine-containing gas" means that the fluorine gas component of the fluorine-containing gas mixture is greater than or equal to about 95%, 98%, or 99% of the fluorine-containing gas mixture The fluorine-containing gas is selected from $SF_6$, $NF_3$, $F_2$, $C_4H_8$, $CHF_3$, or a combination thereof. In one example, the fluorine-containing precursor gas is $NF_3$. In another example, the fluorine-containing precursor gas is $SF_6$. In one example, the processing region 110 consists of or consists essentially of the fluorine-containing gas. In one example, operation 240 is a plasma-free operation meaning that plasma is not present in the processing region 110 during operation 240.

In one aspect, the fluorine-containing gas mixture further includes a noble gas. The noble gas can be selected from argon (Ar), helium (He), neon (Ne), xenon (Xe), krypton (Kr), or a combination thereof.

The fluorine-containing layer 340 is formed when the fluorine-containing gas condenses on the exposed surfaces of the inert layer 330. In the example depicted in FIG. 3C, the fluorine-containing layer 340 is formed on the on a top surface 332 of the inert layer 330, a bottom surface 334 of the inert layer 330, a first sidewall 336a of the noble gas layer, and a second sidewall 336b of the inert layer 330. The fluorine-containing layer 340 can be a conformal layer or a non-conformal layer. During operation 240, the noble gas mixture is flowed into the chamber while the substrate is maintained at the cryogenic temperature. The cryogenic temperature is selected such that the fluorine-containing gas can flow by surface dispersion forces and passivate the surfaces of the substrate. In one example, where the fluorine-containing gas is $SF_6$, the cryogenic temperature is maintained at from about −120 degrees Celsius to about −105 degrees Celsius. Maintaining the substrate at this cryogenic temperature allows the fluorine-containing gas to flow into the chamber as a gas and condense on the deposited inert layer 330.

In one example, during operation 240, for a 300 mm substrate in an appropriately sized chamber, the flow rate of the fluorine-containing gas can be from about 50 sccm to about 500 sccm (e.g., from about 50 sccm to about 300 sccm). The flow rate of the fluorine-containing gas can be flowed into the chamber to maintain an overall chamber pressure of about 30 mTorr to about 110 mTorr (e.g., between about 30 mTorr and about 100 mTorr; between about 40 mTorr and about 80 mTorr; between about 40 mTorr and about 50 mTorr; or between about 70 mTorr and about 80 mTorr). In one example, the overall chamber pressure during operation 240 is slightly higher than the overall chamber pressure during operation 230. For example the overall chamber pressure during operation 230 can be from about 25 mTorr and about 80 mTorr and the overall chamber pressure during operation 240 can be from about 40 mTorr and about 85 mTorr.

In one example, operations 230 and 240 do not overlap meaning that the noble gas flow of operation 230 is stopped before the flow of fluorine-containing gas into the processing region 110 of operation 240 begins. In another example, operations 230 and 240 partially overlap meaning that the noble gas of operation 230 is still flowing into the processing region while the fluorine-containing gas of operation 240 begins.

Figure 3D:
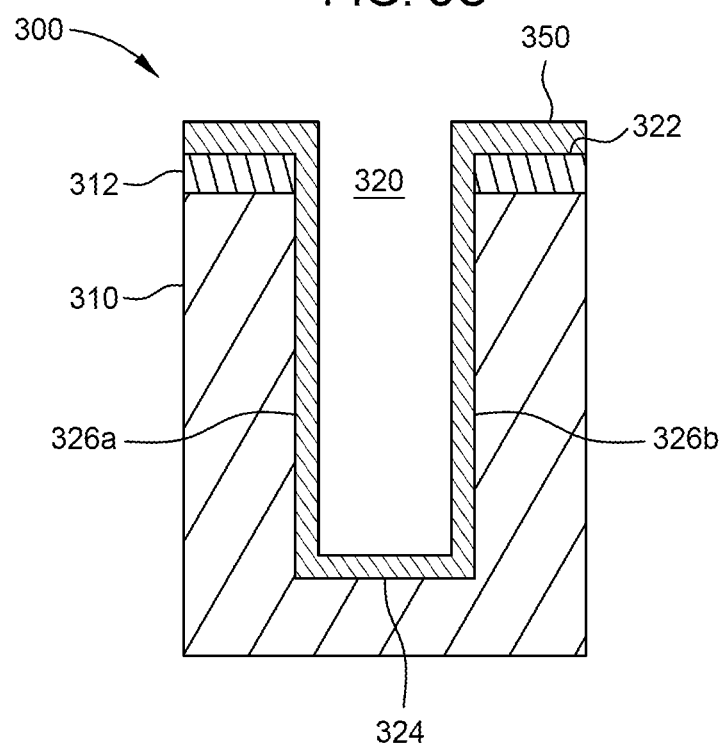

At operation 250, the inert layer 330 and the fluorine-containing layer 340 are exposed to energy to form a passivation layer 350 as shown in FIG. 3D. The energy activates the inert layer 330 and the fluorine-containing layer 340 to form the passivation layer 350 on the sidewalls 326a, 326b of the feature 320. Not to be bound by theory but it is believed that the passivation layer 350 prevents or slows lateral etching of the feature 320 as the feature 320 is etched in a vertical direction. In one example where the inert layer 330 is formed from xenon and the fluorine-containing layer 340 is formed from $SF_6$, the inert layer 330 and the fluorine-containing layer 340 react to form a xenon fluoride passivation layer. Xenon forms a stable molecule with fluorine. The xenon fluoride can include at least one of xenon difluoride ($XeF_2$), xenon tetrafluoride ($XeF_4$), and xenon hexafluoride ($XeF_6$).

The energy source provides an excitation energy, such as an energy having an ultraviolet or RF frequency to activate the deposited inert layer 330 and the fluorine-containing layer 340 to form the passivation layer 350. In one aspect, the energy is formed from an ultraviolet (UV) source and UV photons activate the deposited inert layer 330 and the fluorine-containing layer 340 to form the passivation layer 350. In one example, the UV power can be from about 20 percent to about 100 percent (e.g., from about 20 percent to about 80 percent; from about 30 percent to about 50 percent). The UV power can be between about 200 Watts and about 3,000 Watts (e.g., between about 1,100 Watts and about 2,500 Watts; between about 1,500 Watts and about 2,000 Watts). In another example, the UV power can be from about 20 percent to about 100 percent (e.g., from about 20 percent to about 80 percent; from about 30 percent to about 50 percent). The UV power can be between about 200 Watts and about 1,000 Watts (e.g., between about 200 Watts and about 500 Watts; between about 250 Watts and about 350 Watts).

In another aspect, the energy is a plasma formed from a radio frequency (RF) power source in the presence of a plasma precursor gas mixture. Exposure to RF power ionizes at least a portion of the plasma precursor gas mixture, forming the plasma. RF power at a frequency between about 10 kHz and about 14 MHz is applied at a power level between about 1,000 W and about 5,000 W (e.g., between about 2,000 W and about 3,000 W, or about 2,500 W) to create the plasma. In one example, a frequency of 13.56 MHz is used. In another example, a lower frequency of up to 400 kHz, for example, 350 kHz is used. The secondary power can be applied at a power level of from about 10 watts to about 500 watts (e.g., from about 200 watts to about 400 watts; about 250 watts). The plasma precursor gas mixture includes an inert gas. In one example, the inert gas is helium and the plasma activation produces helium ions in the processing region 110, which activate the deposited inert layer 330 and the fluorine-containing layer 340 to form the passivation layer 350. In another example, the inert gas includes a combination of argon and helium and the plasma activation produce ions in the processing region 110, which activate the deposited inert layer 330 and the fluorine-containing layer 340 to form the passivation layer 350. In one example, operation 250 is a bias-free process meaning that bias is not applied to the substrate.

In one aspect, during operation 250, the inert layer 330 and the fluorine-containing layer 340 are exposed to an ion flux to form the passivation layer 350. The ion flux may be of one or more types of atomic or molecular species having a low ion energy. As such, in one aspect, the species facilitate the reaction of the inert layer 330 with the fluorine-containing layer 340 rather than chemically react with the inert layer 330 and the fluorine-containing layer 340 and therefore the ion flux is to originate from a source gas having relatively low chemical reactivity with the target constituent. Exemplary ionic species include helium ions, neon ions, xenon ions, nitrogen ions, or argon ions with helium ions.

In one example, during operation 250, for a 300 mm substrate in an appropriately sized chamber, the flow rate of the helium gas can be from about 100 sccm to about 500 sccm (e.g., from about 100 sccm to about 300 sccm). The helium gas can be flowed into the chamber to maintain an overall chamber pressure of about 10 mTorr to about 30 mTorr (e.g., between about 10 mTorr and about 20 mTorr; or between about 20 mTorr and about 30 mTorr). In one example, the cryogenic temperature is maintained during operation 250. In some implementations, the temperature of the substrate can be ramped to between about 500 degrees Celsius and about 1100 degrees Celsius, such as about 800 degrees Celsius.

Figure 3E:
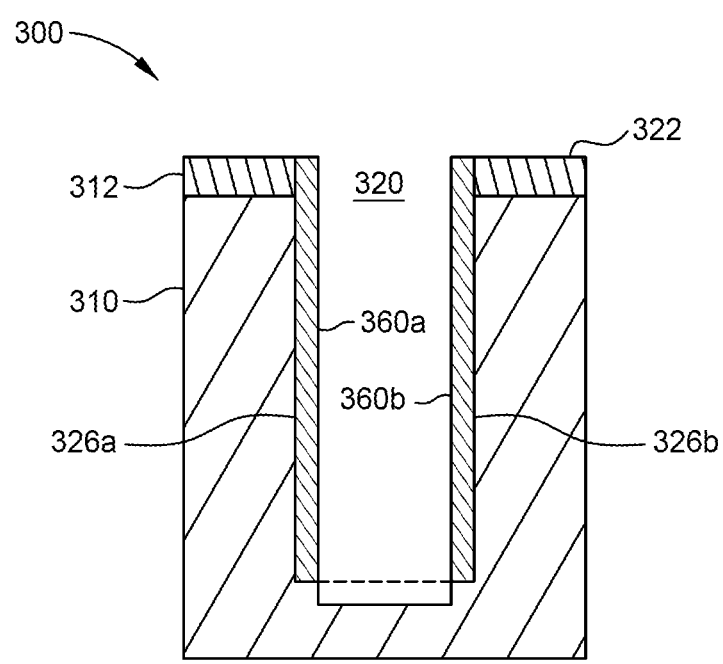

At operation 260, the substrate/feature are bombarded with an ion flux to etch the substrate. In one example, the ion flux is anisotropic such that exposure of the passivated sidewalls of the feature is reduced. The ion flux bombards the portions of the passivation layer 350 overlaying the horizontal surfaces such as the top surface 322 and the bottom surface 324 of the substrate feature as shown in FIG. 3E. Removal of the passivation layer 350 covering the top surface 322 exposes the mask layer 312 and removal of the passivation layer covering the bottom surface 324 exposes the silicon material at the bottom of the feature 320. Portions 360a, 360b of the passivation layer 350 remain on the sidewalls 326a, 326b.

The ion flux can be produced using the same gases and low frequency RF power from operation 250. The ion flux can be produced from an inert gas using a low frequency RF source power. The ion flux may be of one or more types of atomic or molecular species having a low ion energy. Exemplary ionic species include helium ions, neon ions, xenon ions, nitrogen ions, argon ions, or combinations thereof having a low ionization potential such that very low plasma DC biases can be provided to reduce energy levels of the ion flux. Process pressures are advantageously below 10 mTorr for more directionality and more advantageously below 5 mTorr. Low RF powers on the order of 50 W to 100 W, depending on the ionization potential of the feed gas, have been found advantageous for modifying a low-k dielectric film by knocking out carbon species from the silicon-oxide matrix.

In one example, the inert gas is helium and the plasma activation produces helium ions in the processing region 110, which bombard and activate the passivation layer 350. In another example, the inert gas is a mixture of helium and argon and the plasma activation produces helium ions in the processing region 110, which bombard and activate the passivation layer 350. Fluorine from the activated passivation layer 350 etches silicon from the bottom surface 324 of the substrate 300.

During operation 260, bias is also applied to the substrate 300 to direct ions toward the horizontal surfaces of the substrate 300. The bias may be generated using a power from about 50 Watts to about 1500 Watts, for example, from about 50 Watts to about 250 Watts; or from about 50 Watts to about 100 Watts. In one aspect, an RF bias power is applied to an electrode in the substrate support assembly 101, for example, the chucking electrode 126. In one example, an RF bias power, with a frequency of between about 2 MHz and about 13.56 MHz, can be applied at a power less than 500 Watts, such as between about 50 Watts to about 250 Watts, such as about 50 Watts to about 100 Watts.

Not to be bound by theory but it is believed that bombarding the passivation layer 350 with the ion flux separates fluorine from the noble element allowing the fluorine to bond with the silicon of the silicon layer 310 and remove or "etch" the silicon from the silicon layer 310. The etching of operation 260 can be considered atomic layer etching or molecular level etching (MLE) since the portion removed is on the order of the dimension of the molecular constituents in the silicon film.

It is noted that operations 230 to 260 may be repeatedly performed or cycled in a cycle of passivation layer repair followed by etching of the gate material to achieve a targeted etch depth of the silicon material.

Implementations can include one or more of the following potential advantages. By utilizing the passivation and etching techniques described herein, features with high aspect ratios, can be etched and shaped in a controlled manner that can provide the targeted profile with the substantially sharp right angle and upright (e.g., straight, vertical) sidewalls with steep slope and accurate dimensions. Using an inert layer of noble gas as a precursor to etching provides a scheme, which allows for atomic layer etch at low temperatures. Atomic layer etch at low temperatures can reduce or eliminate sidewall etch and provide more vertical features, which improves device performance and yield. In addition, since the first layer of precursor is inert, aggressive chemistries like fluorine can be used for the etching process while suppressing any spontaneous etching.

Thus, implementations of etching a silicon material to form features with targeted edge/corner profile and aspect ratios are provided. By utilizing a passivation mode and an etching mode, a controlled ion trajectory/directionality as well as sidewall/corner passivation protection may be obtained so as to etch the silicon layer in a manner that yields features in the silicon layer with accurate and right angle corners and vertical sidewall profile as well as feature aspect ratios. In addition, the passivation and etching processes may be performed in a single chamber without breaking vacuum, which reduces system complexity.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to aspects of the present disclosure, other and further aspects of the present disclosure may be devised without departing from the basic scope thereof, and the scope thereof is determined by the claims that follow.

The invention claimed is:

1. An etching method, comprising:
   flowing a first noble gas into a processing region of a processing chamber;
   contacting an exposed region of a substrate with the first noble gas such that the first noble gas is adsorbed on a surface of the exposed region, wherein the substrate is maintained at a cryogenic temperature which encompasses a triple point temperature of the first noble gas;
   forming a first layer from the first noble gas of a predetermined thickness on the surface of the exposed region;
   flowing a fluorine-containing precursor gas into the processing region;
   forming a second layer from the fluorine-containing precursor gas of a predetermined thickness on the first layer;
   forming a passivation layer from the first layer and the second layer; and
   etching material from exposed regions of the substrate.

2. The etching method of claim 1, wherein the cryogenic temperature is from about −105 degrees Celsius to about −120 degrees Celsius.

3. The etching method of claim 1, wherein the cryogenic temperature is from about −150 degrees Celsius to about −160 degrees Celsius.

4. The etching method of claim 1, wherein the first noble gas is selected from the group consisting of xenon and krypton.

5. The etching method of claim 3, wherein the fluorine-containing precursor gas is selected from the group consisting of $SF_6$, $NF_3$, and $F_2$.

6. The etching method of claim 1, wherein the etching method is repeated for multiple cycles to achieve a targeted etch depth of the substrate.

7. The etching method of claim 1, further comprising stop stopping the flow of the first noble gas into the processing region prior to flowing the fluorine-containing precursor gas into the processing region.

8. The etching method of claim 1, wherein flowing the first noble gas into the processing region and flowing the fluorine-containing precursor gas into the processing region at least partially overlap.

9. The etching method of claim 1, wherein forming the passivation layer comprises exposing the first layer and the second layer to energy selected from the group consisting of plasma and ultraviolet photons.

10. The etching method of claim 1, wherein the substrate comprises a low-k dielectric material.

11. The etching method of claim 1, wherein the substrate comprises a silicon layer.

12. An etching method, comprising:
   receiving a substrate on a substrate support positioned in a processing region of a processing chamber, the substrate support having a chiller;
   flowing a first noble gas into the processing region;
   contacting an exposed region of the substrate with the first noble gas such that the first noble gas is adsorbed on a surface of the exposed region, wherein the substrate is cooled to a cryogenic temperature of about −100 degrees Celsius or lower by the chiller and the cryogenic temperature encompasses a triple point temperature of the first noble gas;
   forming a first layer from the first noble gas of a predetermined thickness on the surface of the exposed region;
   flowing a fluorine-containing precursor gas into the processing region;
   forming a second layer from the fluorine-containing precursor gas of a predetermined thickness on the first layer;
   forming a passivation layer from the first layer and the second layer; and
   etching a material from exposed regions of the substrate.

13. The etching method of claim 12, wherein the cryogenic temperature is from about −105 degrees Celsius to about −120 degrees Celsius.

14. The etching method of claim 12, wherein the fluorine-containing precursor gas is selected from the group consisting of $SF_6$, $NF_3$, and $F_2$.

15. The etching method of claim 14, wherein the first noble gas is xenon.

16. The etching method of claim 12, wherein etching the material from the exposed regions of the substrate comprises:
   applying a bias voltage to an electrode in the substrate support; and
   flowing helium gas into the processing region.

17. The etching method of claim 12, wherein the passivation layer forms on sidewalls of a feature formed in the substrate and prevents or slows lateral etching of the feature as the feature is etched in a vertical direction in the substrate.

18. An etching method, comprising:

receiving a substrate on a substrate support positioned in a processing region of a processing chamber, the substrate having a substrate surface and at least one feature formed thereon, the at least one feature extending from the substrate surface and having sidewalls and a bottom surface, the substrate support having a chiller operable to cool the substrate;

cooling the substrate to a cryogenic temperature encompassing a triple point temperature of a xenon precursor gas;

forming a xenon fluoride passivation layer over at least the sidewalls, comprising:

contacting the substrate with the xenon precursor gas such that the xenon precursor gas forms a xenon layer of a predetermined thickness on a surface of the sidewalls;

contacting the xenon layer with a fluorine-containing precursor gas to form a fluorine-containing layer of a predetermined thickness on the xenon layer;

exposing the xenon layer and the fluorine-containing layer to ultraviolet photons to form the xenon fluoride passivation layer; and etching a material from the bottom surface of the feature.

19. The etching method of claim 18, wherein etching the material from the bottom surface of the feature comprises:

applying a bias voltage to an electrode in the substrate support;

flowing helium gas into the processing region to form helium ions; and bombarding the xenon fluoride passivation layer with the helium ions.

20. The etching method of claim 19, wherein etching the material from the bottom surface of the feature comprises exposing the bottom surface to fluorine from the xenon fluoride passivation layer.

* * * * *